United States Patent
Chen et al.

(10) Patent No.: US 11,911,809 B2
(45) Date of Patent: Feb. 27, 2024

(54) PREVENTIVE MAINTENANCE METHOD FOR CHAMBER OF METAL ETCHING MACHINE

(71) Applicant: Shanghai Huali Microelectronics Corporation, Shanghai (CN)

(72) Inventors: Minjie Chen, Shanghai (CN); Jin Xu, Shanghai (CN); Zaifeng Tang, Shanghai (CN); Yu Ren, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 17/958,548

(22) Filed: Oct. 3, 2022

(65) Prior Publication Data
US 2023/0143115 A1 May 11, 2023

(30) Foreign Application Priority Data
Nov. 9, 2021 (CN) .......................... 202111319327.1

(51) Int. Cl.
| B08B 5/00 | (2006.01) |
| H01L 21/67 | (2006.01) |
| B08B 9/08 | (2006.01) |
| H01L 21/683 | (2006.01) |

(52) U.S. Cl.
CPC .................. B08B 5/00 (2013.01); B08B 9/08 (2013.01); H01L 21/67069 (2013.01); H01L 21/6831 (2013.01); B08B 2209/08 (2013.01)

(58) Field of Classification Search
CPC ......... B08B 5/00; B08B 9/08; B08B 2209/08; H01L 21/67069; H01L 21/6831
See application file for complete search history.

(56) References Cited

U.S. PATENT DOCUMENTS

| 2002/0162827 | A1* | 11/2002 | Yeh | ........................ B08B 7/0035 |
| | | | | 204/298.31 |
| 2008/0041819 | A1* | 2/2008 | Kim | .................. H01J 37/32862 |
| | | | | 134/1.2 |
| 2012/0091095 | A1* | 4/2012 | Wang | ................ H01J 37/32862 |
| | | | | 216/37 |
| 2020/0294777 | A1* | 9/2020 | Hirota | ............... H01J 37/32862 |
| 2023/0143115 | A1* | 5/2023 | Chen | ........................ B08B 9/08 |
| | | | | 134/22.18 |

FOREIGN PATENT DOCUMENTS

EP     2505687 A1 * 10/2012 ............. C23C 14/14

OTHER PUBLICATIONS

Machine Translation of KR20030085879A (Year: 2003).*
Machine Translation of KR20010004243A (Year: 2001).*
Machine Translation of JP5013484B2 (Year: 2012).*

* cited by examiner

Primary Examiner — Sharidan Carrillo
(74) Attorney, Agent, or Firm — Banner & Witcoff, Ltd.

(57) ABSTRACT

The present application discloses a preventive maintenance method for a chamber of a metal etching machine. An optimized burning cleaning recipe is added before the chamber is opened, and metal substances remaining on the surface of an electrostatic chuck are removed by adopting a cleaning/pumping down multi-step alternate method. Before the chamber is opened for preventive maintenance, the phenomenon of metal particles remaining on the surface of the electrostatic chuck can be significantly improved, thus solving the downtime problem caused by abnormal backside helium and ensuring the stability of mass production.

7 Claims, 3 Drawing Sheets

| Chamber enters MTBC | ⇒ | Open the chamber for PM | ⇒ | O₂ burning cleaning | ⇒ | PM recovery season |

PREVENTIVE MAINTENANCE METHOD FOR CHAMBER OF METAL ETCHING MACHINE

CROSS-REFERENCE TO RELATED APPLICATIONS

This application claims the priority to Chinese Patent Application No. 202111319327.1, filed on Nov. 9, 2021, the disclosure of which is incorporated herein by reference in its entirety.

TECHNICAL FIELD

The present application relates to a semiconductor dry etching technology, in particular to a preventive maintenance method for a chamber of a metal etching machine.

BACKGROUND

Driven by Moore's law, with the gradual reduction of semiconductor process size, many new processes have been derived for the stability of device performance and the needs of process. Taking the Back Side Illumination (BSI) process as an example, in order to improve the process window in the lead loop, a W etchback dry etching process is developed, which has the advantage of stabilizing the monitoring parameters such as tungsten plug morphology and critical dimension.

The development of this kind of metal etching process has brought new challenges to the daily maintenance of equipment, especially the Preventive Maintenance (PM) of the etching chamber of the metal etching machine. The current PM process is as illustrated in FIG. 1: after the chamber enters the Mean Time Between Clean (MTBC) cycle, the equipment engineer opens the chamber for PM. For the sake of the clean room environment TVOC (Total Volatile Organic Compounds) monitoring and other considerations, DI water is required to be used to treat the chamber. At present, organic solvents are no longer allowed to be used for cleaning and maintenance, the removal effect of metal particles remaining on the surface of the ElectroStatic Chuck (ESC) and the chamber wall is poor. It is observed that there are particles that are difficult to remove on the surface of the ESC, as illustrated in FIG. 2. EDX (Energy Dispersive X-Ray Spectroscopy) analysis found that it contains metal components W/Al and the like, so there is the problem of metal particle residues.

After the PM of the metal etching chamber, the metal particles on the surface of the ESC will cause abnormal flow of backside helium on the wafer, which has a certain probability of abnormal downtime of backside helium in the PM recovery season. Such problems increase the uncertainty of the recovery of the chamber of the metal etching machine, hinder the online product tape-out, and cause the loss of production capacity, human, material and financial resources to the wafer factory. Therefore, solutions need to be found.

BRIEF SUMMARY

The technical problem to be solved by the present application is to provide a preventive maintenance method for a chamber of a metal etching machine. Before the chamber is opened for preventive maintenance, the phenomenon of metal particles remaining on the surface of the electrostatic chuck can be significantly improved, thus solving the downtime problem caused by abnormal backside helium.

In order to solve the technical problem, the preventive maintenance method for the chamber of the metal etching machine provided by the present application includes the following steps:

S0: the chamber of the metal etching machine entering mean time between clean;

S1: before the etching chamber of the metal etching machine is opened, cleaning an electrostatic chuck in the chamber and a chamber wall by using an $O_2$ burning cleaning method;

S2: exhausting and pumping down the chamber;

S3: cleaning the electrostatic chuck in the chamber and the chamber wall by using an $NF_3/Cl_2$ burning cleaning method;

S4: exhausting and pumping down the chamber;

S5: opening the etching chamber of the metal etching machine for preventative maintenance.

Further, after step S5, step S6 of cleaning the electrostatic chuck in the chamber and the chamber wall by using the $O_2$ burning cleaning method is performed.

Further, when the chamber is pumped down from an exhaust port, the opening of an exhaust valve at the exhaust port of the chamber is maximized.

Further, step S1 includes the following steps:

S11: injecting $O_2$ from a gas inlet into the chamber at a flow greater than a first flow to clean the electrostatic chuck in a mode that the internal pressure of the chamber is lower than a first pressure by using the $O_2$ burning cleaning method;

S12: keeping the flow of $O_2$ injected form the gas inlet into the chamber unchanged to clean the electrostatic chuck and the chamber wall in a mode that the internal pressure of the chamber is higher than a second pressure by using the $O_2$ burning cleaning method, the second pressure being higher than the first pressure.

Further, the first pressure is 8.6 $mt/m^2$;

the second pressure is 43 $mt/m^2$;

the first flow is 200 sccm.

Further, step S3 includes the following steps:

S31: injecting $NF_3$ from the gas inlet into the chamber at a flow greater than a second flow, injecting $Cl_2$ at a flow greater than a third flow and injecting $SF_6$ at a flow smaller than a fourth flow to clean the electrostatic chuck in the mode that the internal pressure of the chamber is lower than the first pressure by adopting the $NF_3/Cl_2$ burning cleaning method, the second flow being greater than the third flow greater than the fourth flow;

S32: keeping the flow of $NF_3$, $Cl_2$ and $SF_6$ injected form the gas inlet into the chamber unchanged, simultaneously injecting $O_2$ from the gas inlet into the chamber at a flow smaller than a fifth flow and injecting $H_2$ at a flow smaller than a sixth flow to clean the electrostatic chuck and the chamber wall in the mode that the internal pressure of the chamber is higher than the second pressure by using the $NF_3/Cl_2$ burning cleaning method, the second flow being greater than the fifth flow greater than the sixth flow.

Further, the second flow is equal to the first flow.

Further, the second flow is 200 sccm, the third flow is 50 sccm, the fourth flow is 10 sccm, the fifth flow is 50 sccm and the sixth flow is 20 sccm.

In the preventative maintenance method for the chamber of the metal etching machine provided by the present application, an optimized burning cleaning recipe is added before the chamber is opened, and metal substances remaining on the surface of the ElectroStatic Chuck (ESC) are removed by adopting a cleaning/pumping down multi-step alternate method. Before the chamber is opened for Preventive Maintenance (PM), the phenomenon of metal particles remaining on the surface of the ESC can be significantly improved, thus solving the downtime problem caused by abnormal backside helium and ensuring the stability of mass production.

BRIEF DESCRIPTION OF THE DRAWINGS

In order to more clearly describe the technical solution of the present application, the drawings required for the present application will be briefly introduced below. It is obvious that the drawings in the following description are only some embodiments of the present application. Those skilled in the art may obtain other drawings based on these drawings without contributing any inventive labor.

FIG. 1 illustrates a schematic diagram of a recovery process of existing preventative maintenance.

FIG. 2 illustrates a schematic diagram of particles remaining on a surface of an electrostatic chuck in existing preventative maintenance.

DETAILED DESCRIPTION

The technical solution of the present application will be clearly and completely described below with reference to the drawings. Obviously, the described embodiments are part of the embodiments of the present application, not all of them. Based on the embodiments of the present application, all other embodiments obtained by those skilled in the art without contributing any inventive labor still fall within the scope of protection of the present application.

Embodiment 1

Figure 3:
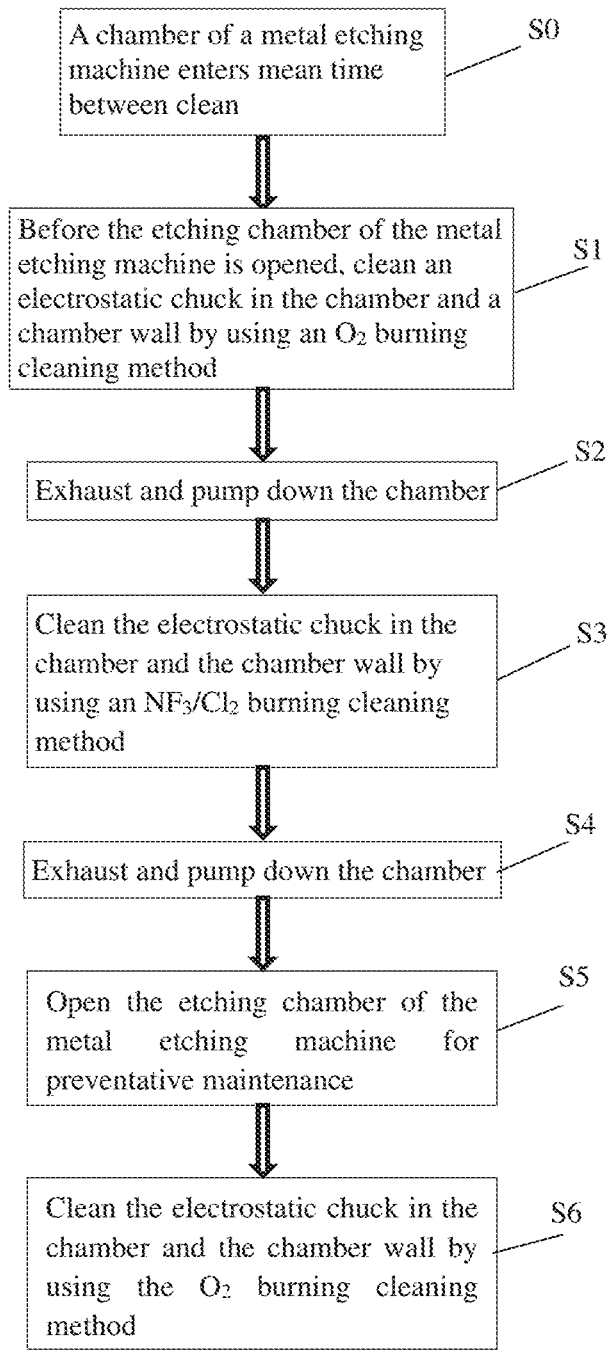
FIG. 3 illustrates a flowchart of a preventive maintenance method for a chamber of a metal etching machine according to an embodiment of the present application.

Referring to FIG. 3, a Preventive Maintenance (PM) method for a chamber of a metal etching machine, which includes the following steps:

S0: the chamber of the metal etching machine entering Mean Time Between Clean (MTBC);

S1: before the etching chamber of the metal etching machine is opened, cleaning an ElectroStatic Chuck (ESC) in the chamber and a chamber wall by using an $O_2$ burning cleaning method;

S2: exhausting and pumping down the chamber to remove organic polymers in the chamber;

S3: cleaning the ESC in the chamber and the chamber wall by using an $NF_3/Cl_2$ burning cleaning method;

S4: exhausting and pumping down the chamber to remove metal polymers in the chamber;

S5: opening the etching chamber of the metal etching machine for PM.

Further, after step S5, step S6 of cleaning the ESC in the chamber and the chamber wall by using the $O_2$ burning cleaning method is performed.

Further, when the chamber is pumped down from an exhaust port, the opening of an exhaust valve at the exhaust port of the chamber is maximized.

Figure 4:
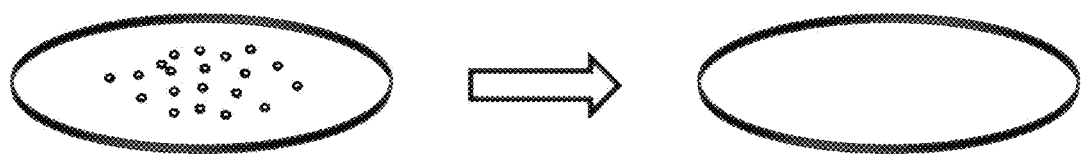
FIG. 4 illustrates a schematic diagram of an improved situation of particles remaining on a surface of an electrostatic chuck in a preventive maintenance method for a chamber of a metal etching machine according to an embodiment of the present application.

In the preventative maintenance method for the chamber of the metal etching machine according to embodiment 1, an optimized burning cleaning recipe is added before the chamber is opened, and metal substances (such as WxFy/AlxFy) remaining on the surface of the ESC are removed by adopting a cleaning/pumping down multi-step alternate method. As illustrated in FIG. 4, before the chamber is opened for PM, the phenomenon of metal particles remaining on the surface of the ESC can be significantly improved, thus solving the downtime problem caused by abnormal backside helium and ensuring the stability of mass production. This method is applicable to the field of dry etching process technology of all semiconductor factories.

Embodiment 2

Based on the preventive maintenance method for the chamber of the metal etching machine according to embodiment 1, step S1 includes the following steps:

S11: injecting $O_2$ from a gas inlet into the chamber at a flow greater than a first flow to clean the ESC in a mode that the internal pressure of the chamber is lower than a first pressure by using the $O_2$ burning cleaning method;

S12: keeping the flow of $O_2$ injected form the gas inlet into the chamber unchanged to clean the ESC and the chamber wall in a mode that the internal pressure of the chamber is higher than a second pressure by using the $O_2$ burning cleaning method, the second pressure being higher than the first pressure.

Further, the first pressure is 8.6 $mt/m^2$; the second pressure is 43 $mt/m^2$; the first flow is 200 sccm.

Embodiment 3

Based on the preventive maintenance method for the chamber of the metal etching machine according to embodiment 2, step S3 includes the following steps:

S31: injecting $NF_3$ from the gas inlet into the chamber at a flow greater than a second flow, injecting $Cl_2$ at a flow greater than a third flow and injecting $SF_6$ at a flow smaller than a fourth flow to clean the ESC in the mode that the internal pressure of the chamber is lower than the first pressure by adopting the $NF_3/Cl_2$ burning cleaning method, the second flow being greater than the third flow greater than the fourth flow;

S32: keeping the flow of $NF_3$, $Cl_2$ and $SF_6$ injected form the gas inlet into the chamber unchanged, simultaneously injecting $O_2$ from the gas inlet into the chamber at a flow smaller than a fifth flow and injecting $H_2$ at a flow smaller than a sixth flow to clean the ESC and the chamber wall in the mode that the internal pressure of the chamber is higher than the second pressure by using the $NF_3/Cl_2$ burning cleaning method, the second flow being greater than the fifth flow greater than the sixth flow.

Further, the second flow is equal to the first flow.

Further, the second flow is 200 sccm, the third flow is 50 sccm, the fourth flow is 10 sccm, the fifth flow is 50 sccm and the sixth flow is 20 sccm.

In the preventative maintenance method for the chamber of the metal etching machine according to embodiment 3, when using the $NF_3/Cl_2$ burning cleaning method for ESC cleaning and chamber wall cleaning in the chamber, firstly $NF_3$, $Cl_2$ and $SF_6$ are injected in the low pressure mode for ESC cleaning, then the flow of $NF_3$, $Cl_2$ and $SF_6$ are kept unchanged, a small amount of $O_2$ and $H_2$ are added, and then the mode is switched to the high pressure mode for chamber wall cleaning. Not only the cleaning effect is good, but also the chamber can be protected.

What are described above are only preferred embodiments of the present application, which, however, are not used to limit the present application. Any modification, equivalent replacement, improvement and the like made within the essence and principle of the present application shall be included in the scope of protection of the present application.

What is claimed is:

1. A preventive maintenance method for a chamber of a metal etching machine, wherein the preventive maintenance method for the chamber of the metal etching machine comprises the following steps:
   S0: the chamber of the metal etching machine entering a cleaning cycle;
   S1: before the chamber of the metal etching machine is opened, cleaning an electrostatic chuck in the chamber and a chamber wall by a burning reaction between $O_2$ and metal particles, wherein step S1 comprises the following steps:
      S11: injecting the $O_2$ into the chamber from a gas inlet, wherein an $O_2$ injection flow rate is greater than a set first flow rate and a pressure inside the chamber is lower than a set first pressure, to clean the electrostatic chuck by the burning reaction between the $O_2$ and the metal particles; and
      S12: keeping the $O_2$ injection flow rate unchanged, making an internal pressure of the chamber higher than a set second pressure, to clean the electrostatic chuck and the chamber wall by the burning reaction between the $O_2$ and the metal particles, wherein the set second pressure is higher than the set first pressure;
   S2: exhausting and pumping down the chamber;
   S3: cleaning the electrostatic chuck in the chamber and the chamber wall by a burning reaction between $NF_3$/$Cl_2$ and the metal particles;
   S4: exhausting and pumping down the chamber; and
   S5: opening the chamber of the metal etching machine for preventative maintenance.

2. The preventive maintenance method for the chamber of the metal etching machine according to claim 1, wherein, after step S5, a step S6 of cleaning the electrostatic chuck in the chamber and the chamber wall by the burning reaction between the $O_2$ and the metal particles.

3. The preventive maintenance method for the chamber of the metal etching machine according to claim 1, wherein, when the chamber is pumped down from an exhaust port, an opening of an exhaust valve at the exhaust port of the chamber is a maximum designed opening of the exhaust valve.

4. The preventive maintenance method for the chamber of the metal etching machine according to claim 1, wherein the set first pressure is 8.6 mt/m$^2$, the set second pressure is 43 mt/m$^2$, and the set first flow rate is 200 sccm.

5. The preventive maintenance method for the chamber of the metal etching machine according to claim 1, wherein step S3 comprises the following steps:
   S31: injecting $NF_3$, $Cl_2$, and $SF_6$ into the chamber from the gas inlet, an $NF_3$ injection flow rate is greater than a second flow rate, a $Cl_2$ injection flow rate is greater than a third flow rate, and an $SF_6$ injection flow rate is smaller than a fourth flow rate, making the pressure inside the chamber lower than the set first pressure, to clean the electrostatic chuck by a burning reaction between the $NF_3$/$Cl_2$ and the metal particles, wherein the second flow rate is greater than the third flow rate, the third flow rate is greater than the fourth flow rate; and
   S32: keeping flow rates of $NF_3$, $Cl_2$, and $SF_6$ injected from the gas inlet into the chamber unchanged, simultaneously injecting $O_2$ and $H_2$ into the chamber from the gas inlet, the $O_2$ injection flow rate is smaller than a fifth flow rate, an $H_2$ injection flow rate is smaller than a sixth flow rate, the internal pressure of the chamber is higher than the set second pressure, to clean the electrostatic chuck by the burning reaction between the $NF_3$/$Cl_2$ and the metal particles, the second flow rate is greater than the fifth flow rate, and the fifth flow rate is greater than the sixth flow rate.

6. The preventive maintenance method for the chamber of the metal etching machine according to claim 5, wherein the second flow rate is equal to the set first flow rate.

7. The preventive maintenance method for the chamber of the metal etching machine according to claim 5, wherein the second flow rate is 200 sccm, the third flow rate is 50 sccm, the fourth flow rate is 10 sccm, the fifth flow rate is 50 sccm, and the sixth flow rate is 20 sccm.

* * * * *